(12) United States Patent
Nagata

(10) Patent No.: US 7,205,843 B2
(45) Date of Patent: Apr. 17, 2007

(54) PROTECTION CIRCUIT FOR POWER AMPLIFIER

(75) Inventor: Hideo Nagata, Ogasa-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 188 days.

(21) Appl. No.: 11/018,317

(22) Filed: Dec. 22, 2004

(65) Prior Publication Data

US 2005/0140452 A1 Jun. 30, 2005

(30) Foreign Application Priority Data

Dec. 25, 2003 (JP) .............................. 2003-428998

(51) Int. Cl.
*H03F 1/52* (2006.01)
(52) U.S. Cl. ..................................... 330/298
(58) Field of Classification Search ............ 330/207 P, 330/298; 455/117
See application file for complete search history.

(56) References Cited

U.S. PATENT DOCUMENTS

| 3,641,451 A | 2/1972 | Hollingsworth et al. .... 330/134 |
| 3,866,136 A | 2/1975 | Augustin et al. ......... 330/207 P |
| 4,122,400 A | 10/1978 | Medendorp et al. ..... 330/207 P |
| 4,419,632 A | 12/1983 | Morris ......................... 330/277 |
| 5,081,425 A * | 1/1992 | Jackson et al. ........... 330/207 P |
| 5,357,089 A | 10/1994 | Prentice ....................... 330/298 |
| 6,259,324 B1 | 7/2001 | Antognetti et al. ......... 330/296 |
| 6,556,815 B1 | 4/2003 | Shibamura ................... 455/126 |
| 2002/0024390 A1 | 2/2002 | Yamashita et al. .......... 330/298 |
| 2003/0218507 A1 | 11/2003 | Inoue et al. ................. 330/298 |

FOREIGN PATENT DOCUMENTS

| JP | 290517 | 7/1990 |
| JP | 09199950 | 7/1997 |
| JP | 2000 295055 | 10/2000 |
| JP | 2000 341145 | 12/2000 |

OTHER PUBLICATIONS

European Search Report dated Apr. 21, 2005. (for EP 04 03 0469).
Scuderi et al., "A High Performance RF Power Amplifier with Protection against Load Mismatches" XP010645004, Institute of Electrical and Electronics Engineers, 2003 IEEE MTT-S International Microwave Symposium Digest (IMS 2003), IEEE MTT-S International Microwave Symposium, IEEE, New York, NY, pp. 699-702, Jun. 8, 2003.

* cited by examiner

*Primary Examiner*—Steven J. Mottola
(74) *Attorney, Agent, or Firm*—Stevens, Davis, Miller & Mosher, LLP

(57) ABSTRACT

A directional coupler is provided on the output side of a power amplifier. An increase in reflected wave power from a load is detected through the directional coupler by an electric power detector (wave detector). Then, a detection signal of an electric power detector is provided to a power amplifier supply voltage control circuit. As a result, the supply voltage supplied to the power amplifier is reduced gradually. By virtue of this, the supply voltage provided to the power amplifier is gradually reduced when the power amplifier approaches a breakdown condition. This protects the power amplifier.

2 Claims, 4 Drawing Sheets

PROTECTION CIRCUIT FOR POWER AMPLIFIER

BACKGROUND OF THE INVENTION

1. Field of the Invention

The present invention relates to a protection circuit for power amplifier for preventing the breakdown of a power amplifier caused by a load change or the like in a high frequency power amplifier such as a mobile communications device.

2. Prior Art

As shown in FIG. 4, a prior art electric power amplifying system comprises an input terminal 201, a power amplifier 202, a power amplifier power supply terminal 203, an output terminal 204, a power amplifier supply voltage control terminal 205, a DC power supply terminal 206, and a power amplifier supply voltage control circuit 207.

A signal inputted through the input terminal 201 is amplified by the power amplifier 202, and then outputted through the output terminal 204. On the other hand, electric power to the power amplifier 202 is supplied through the power amplifier power supply terminal 203. At that time, the power amplifier supply voltage control circuit 207 is controlled through the power amplifier supply voltage control terminal 205 so that a DC voltage inputted through the DC power supply terminal 206 is reduced to a specific voltage.

The power amplifier supply voltage control circuit 207 comprises a buffer amplifier for inputting the voltage of the power amplifier supply voltage control terminal 205 to the power amplifier power supply terminal 203. The power amplifier 202 requires a high current, and hence cannot be connected directly to the power amplifier supply voltage control terminal 205. Thus, the power amplifier supply voltage control circuit 207 is provided.

Nevertheless, this prior art electric power amplifying system does not have the function of protecting the power amplifier from breakdown. Thus, there has been a problem that certain power amplifier operating conditions such as a load change can cause breakdown to the power amplifier.

In a method for avoiding this problem, when an overcurrent flows into a power amplifier, the overcurrent is detected so that the load of the power amplifier is changed. As a result, the power amplifier is protected (e.g., JP-A-2000-295055).

Nevertheless, in this method of changing the load of the power amplifier, the configuration of the variable load circuit is difficult. That is, unless the variable load circuit is provided with the characteristics of a low loss in the normal state, the output power of the power amplifier is reduced, and so is the electric power efficiency.

SUMMARY OF THE INVENTION

An object of the invention is to provide a protection circuit for power amplifier for preventing the breakdown of a power amplifier caused by a change in the operating conditions, such as load change, of the power amplifier, wherein its configuration is simple, no drop occurs in the output power of the power amplifier in normal operation, and a high electric power efficiency is obtained.

A protection circuit for power amplifier according to the invention comprises: breakdown condition detecting means for detecting that a power amplifier approaches a breakdown condition; and supply voltage controlling means for varying a supply voltage supplied to the power amplifier; wherein a detection signal of the breakdown condition detecting means is provided to the supply voltage controlling means, so that the supply voltage provided to the power amplifier is gradually reduced when the power amplifier approaches the breakdown condition.

According to this configuration, the supply voltage provided to the power amplifier is gradually reduced when the power amplifier approaches a breakdown condition. This prevents the power amplifier from approaching the breakdown condition. As a result, the breakdown of the power amplifier is prevented that could be caused by a change in the operating conditions, such as load change, of the power amplifier. The reducing of the supply voltage reduces the power consumption of the power amplifier in a straightforward way, and hence appropriately prevents the breakdown of the power amplifier. Further, in contrast to the case of voltage control using a switch, the voltage is controlled gradually. Thus, when the invention is used in a transmitter, its transmitting operation does not change seriously so that the state of communications remains stable.

In addition, since the load of the power amplifier does not need to be variable, the configuration is simple. Further, no drop occurs in the output power of the power amplifier in normal operation, so that a high electric power efficiency is obtained.

In a protection circuit for power amplifier according to the invention, the breakdown condition detecting means may be composed of reflected wave power detecting means. This reflected wave power detecting means detects an increase in reflected wave power generated by impedance mismatching of a load connected to the power amplifier.

According to this configuration, an increase in the reflected wave power generated by impedance mismatching of the load is detected so that the supply voltage is reduced gradually. This prevents the power amplifier from approaching a breakdown condition as a result of an increase in the reflected wave power.

Further, in a protection circuit for power amplifier according to the invention, a bipolar transistor may be used as a power amplifier device. In this case, the breakdown condition detecting means may be composed of current detecting means for detecting an increase in a current flowing from a base power supply terminal into the base of the bipolar transistor.

According to this configuration, an increase is detected in the current flowing from the base power supply terminal into the base of the bipolar transistor. When an overcurrent is to flow into the collector of the bipolar transistor serving as a power amplifier, the overcurrent is detected so that the supply voltage is reduced gradually. This prevents the overcurrent from flowing into the power amplifier and thereby causing the power amplifier to approach a breakdown condition.

Furthermore, in a protection circuit for power amplifier according to the invention, a field effect transistor may be used as a power amplifier device. In this case, breakdown condition detecting means may be composed of current detecting means for detecting an increase in a current flowing from a gate power supply terminal into the gate of the field effect transistor.

According to this configuration, an increase is detected in the current flowing from the gate power supply terminal into the gate of the field effect transistor is detected. When an overcurrent is to flow into the field effect transistor serving as a power amplifier, the overcurrent is detected so that the supply voltage is reduced gradually. This prevents the overcurrent from flowing into the power amplifier and thereby causing the power amplifier to approach a breakdown condition.

As described above, according to a protection circuit for power amplifier of the invention, a supply voltage provided to a power amplifier is gradually reduced when the power amplifier approaches a breakdown condition. This prevents the power amplifier from approaching a breakdown condition. As a result, the breakdown of the power amplifier is prevented that could be caused by a change in the operating conditions, such as load change, of the power amplifier. Thus, the protection of the power amplifier is achieved.

DESCRIPTION OF THE PREFERRED EMBODIMENTS

Embodiment 1

Figure 1:
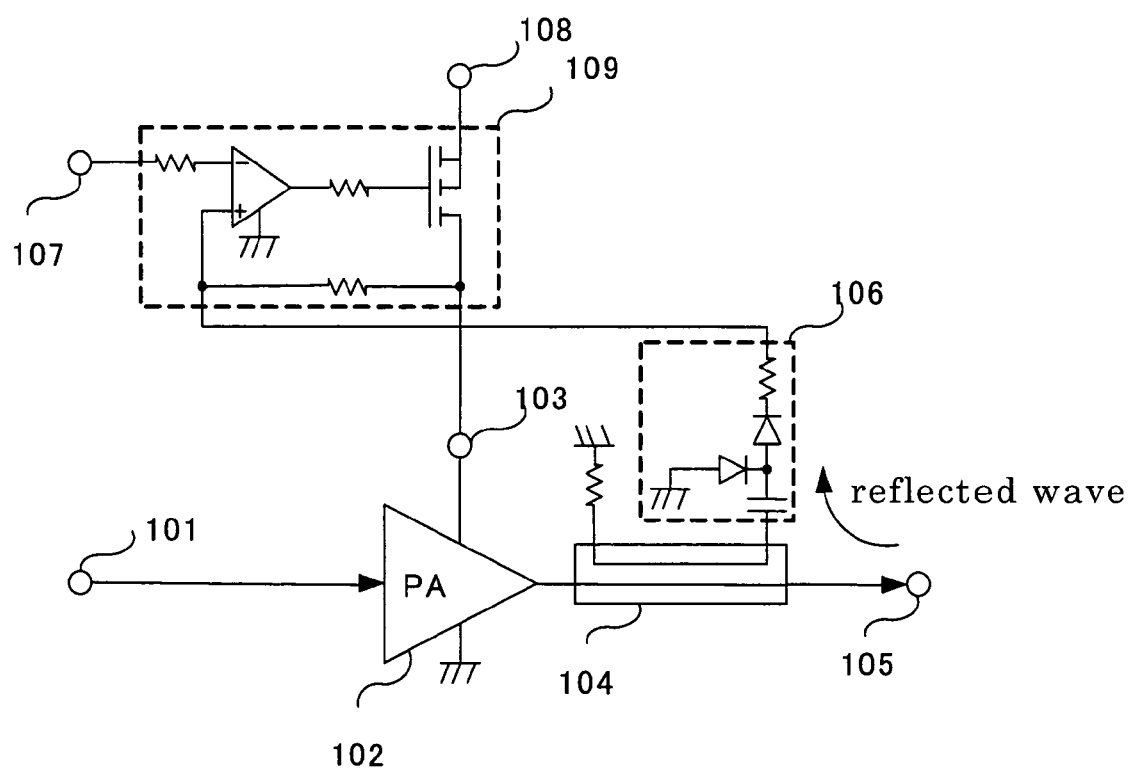
FIG. 1 is a block diagram showing the configuration of an electric power amplifying system containing a protection circuit for power amplifier according to Embodiment 1 of the invention.

FIG. 1 is a block diagram showing the configuration of an electric power amplifying system containing a protection circuit for power amplifier according to Embodiment 1 of the invention. As shown in FIG. 1, the electric power amplifying system comprises an input terminal 101, a power amplifier 102, a power amplifier power supply terminal 103, a directional coupler 104, an output terminal 105, an electric power detector (such as a wave detector) 106, a power amplifier supply voltage control terminal 107, and a DC power supply terminal 108, as well as a power amplifier supply voltage control circuits 109 serving as supply voltage controlling means for varying a supply voltage supplied to the power amplifier 102. The part consisting of the directional coupler 104 and the electric power detector 106 corresponds to reflected wave power detecting means for detecting an increase in reflected wave power generated by impedance mismatching of a load connected to the power amplifier 102, that is, breakdown condition detecting means for detecting that the power amplifier 102 approaches a breakdown condition.

Described below is the operation of the electric power amplifying system containing the protection circuit for power amplifier constructed as described above.

A high frequency signal inputted through the input terminal 101 is amplified by the power amplifier 102, and then outputted through the output terminal 105.

On the other hand, electric power to the power amplifier 102 is supplied through the power amplifier power supply terminal 103. At that time, the power amplifier supply voltage control circuit 109 is controlled by a control signal provided through the power amplifier supply voltage control terminal 107. As a result, the DC voltage inputted through the DC power supply terminal 108 is reduced to a specific voltage, and then applied to the power amplifier 102. This function or operation is the same as that of the prior art power amplifier supply voltage control circuit 207.

However, the power amplifier supply voltage control circuit 109 has the function of protecting the power amplifier 102. This function is not in the prior art. More specifically, when impedance mismatching occurs in the load of the power amplifier 102 occurs, the directional coupler 104 extracts reflected wave power. Then, a signal generated by the voltage conversion of the extracted reflected wave in the electric power detector (wave detector) 106 is inputted into the power amplifier supply voltage control circuit 109. By virtue of this, when a reflected wave is generated by impedance mismatching, the supply voltage of the power amplifier 102 is reduced gradually depending on the level of the reflected wave. This prevents the power amplifier 102 from approaching a breakdown condition, and hence protects the power amplifier 102.

Described below in further detail is the operation of the electric power detector 106 and the power amplifier supply voltage control circuit 109. The electric power detector 106 outputs a voltage depending on the level of the reflected electric power in such a manner that a higher voltage is outputted for a higher level of the reflected electric power. On receiving the output voltage of the electric power detector 106, the supply voltage control circuit 109 reduces the power amplifier supply voltage in response to the output voltage of the electric power detector 106.

According to this embodiment, when the reflected wave power increases owing to impedance mismatching of the load, that is, when the power amplifier 102 approaches a breakdown condition, the supply voltage is gradually reduced. This prevents the power amplifier 102 from approaching a breakdown condition as a result of an increase in the reflected wave power. Thus, the breakdown of the power amplifier 102 is prevented that could be caused by a change in the operating conditions, such as load change, of the power amplifier 102.

In addition, since the load of the power amplifier 102 does not need to be variable, the configuration is simple. Further, no drop occurs in the output power of the power amplifier in normal operation, so that a high electric power efficiency is obtained.

Furthermore, the supply voltage provided to the power amplifier 102 is gradually reduced when the power amplifier 102 approaches a breakdown condition. This causes no large disturbance to the transmitting operation. Thus, the state of communications remains stable.

Embodiment 2

Figure 2:
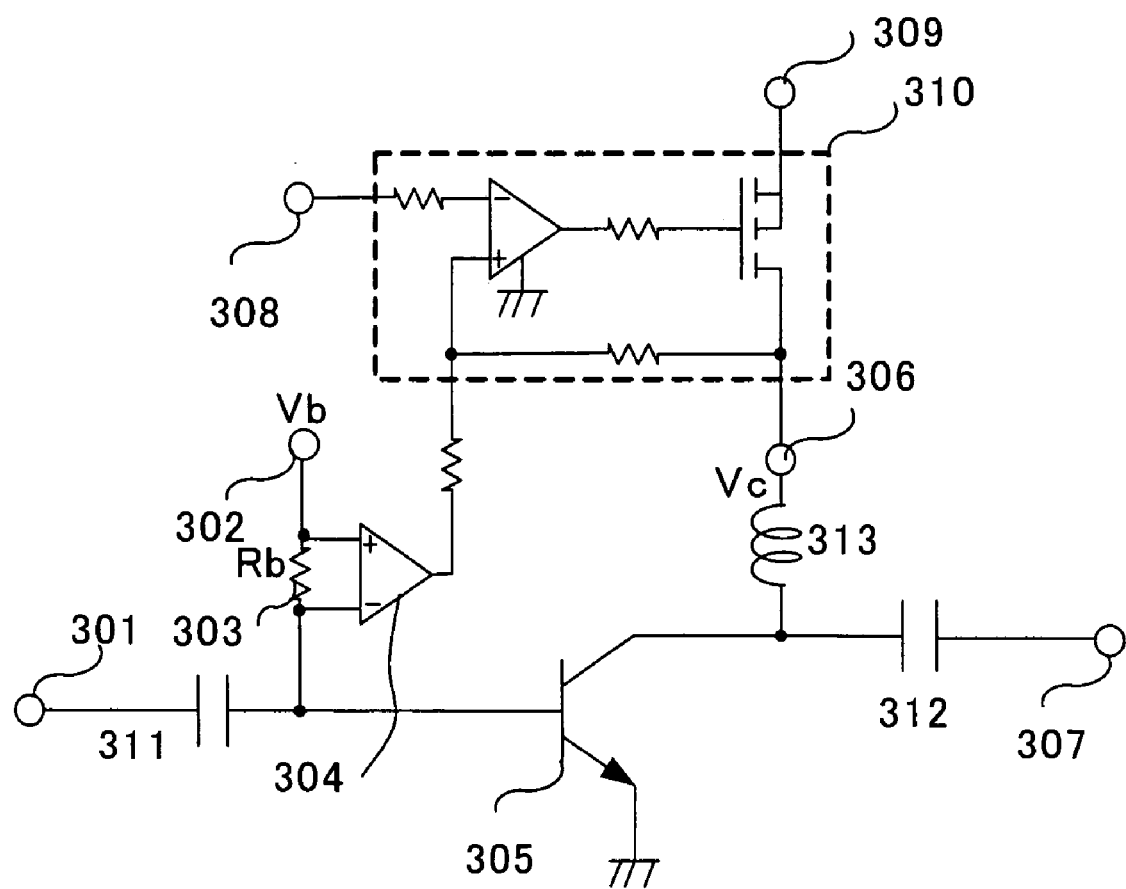
FIG. 2 is a block diagram showing the configuration of an electric power amplifying system containing a protection circuit for power amplifier according to Embodiment 2 of the invention.

FIG. 2 is a block diagram showing the configuration of an electric power amplifying system containing a protection circuit for power amplifier according to Embodiment 2 of the invention. As shown in FIG. 2, the protection circuit for power amplifier comprises an input terminal 301, a base power supply terminal 302, a base resistor 303, a voltage conversion section 304, a bipolar transistor 305, a collector power supply terminal 306, an output terminal 307, a power amplifier supply voltage control terminal 308, a DC power supply terminal 309, a power amplifier supply voltage control circuit 310, capacitors 311 and 312, and an inductor 313. The part consisting of the base resistor 303 and the voltage conversion section 304 corresponds to current detecting means or breakdown condition detecting means for detecting an increase in a current flowing from the base power supply terminal 302 into the base of the bipolar transistor 305.

Described below is the operation of the electric power amplifying system containing the protection circuit for power amplifier constructed as described above.

A high frequency signal or the like inputted through the input terminal 301 is amplified by the power amplifier which uses the bipolar transistor 305 as a power device. The signal is then outputted through the output terminal 307.

On the other hand, electric power is supplied to the bipolar transistor 305 as follows. That is, electric power to the base is supplied through the base power supply terminal 302 via the base resistor 303. Further, electric power to the collector is supplied through the collector power supply terminal 306. At that time, a control signal provided through the power amplifier supply voltage control terminal 308 controls the power amplifier supply voltage control circuit 310. Under this control, a DC voltage inputted through the DC power supply terminal 309 is reduced to a specific voltage, and then applied to the collector of the bipolar transistor 305.

At that time, in the supplying of the collector power, in order to prevent the collector current from flowing excessively and thereby causing breakdown to the bipolar transistor 305, the current is detected that flows from the base power supply terminal 302 into the base of the bipolar transistor 305. That is, a voltage is detected across the base resistor 303. On the basis of the detected voltage, the collector supply voltage of the bipolar transistor 305 serving as a power amplifier is reduced gradually depending on the level of the detected voltage when the collector current is to flow excessively. This prevents the bipolar transistor 305 from approaching a breakdown condition, and hence protects the bipolar transistor 305.

The voltage conversion section 304 outputs a voltage proportional to the base current. When the voltage inputted from the voltage conversion section 304 increases, the power amplifier supply voltage control circuit 310 accordingly reduces the power amplifier supply voltage. At that time, the sensitivity of the voltage conversion section 304 and the operating point of the power amplifier supply voltage control circuit 310 are adjusted into the optimum for the prevention of breakdown of the bipolar transistor 305.

When the collector current flows excessively, an increased current flows from the base power supply terminal 302 into the base of the bipolar transistor 305. This is because in normal operation, a bipolar transistor obeys the relation Ic=Ib×Hfe concerning a DC current amplification factor (Hfe) between the base current and the collector current. In this circuit, when the collector current varies owing to a load change, the base current also varies according to the DC current amplification factor.

According to this configuration, when the voltage increases across the base resistor 303 inserted into the current supply path running from the base power supply terminal 302 to the base of the bipolar transistor 305, that is, when the power amplifier approaches a breakdown condition, the supply voltage is gradually reduced. This prevents an overcurrent from flowing into the collector of the bipolar transistor 305 and thereby causing the bipolar transistor 305 to approach a breakdown condition. Thus, the breakdown of the bipolar transistor 305 is prevented that could be caused by a change in the operating conditions, such as load change, of the power amplifier.

In addition, since the load of the power amplifier does not need to be variable, the configuration is simple. Further, no drop occurs in the output power of the power amplifier in normal operation, so that a high electric power efficiency is obtained.

Furthermore, the supply voltage provided to the power amplifier is gradually reduced when the power amplifier approaches a breakdown condition. This causes no large disturbance to the transmitting operation. Thus, the state of communications remains stable.

Embodiment 3

Figure 3:
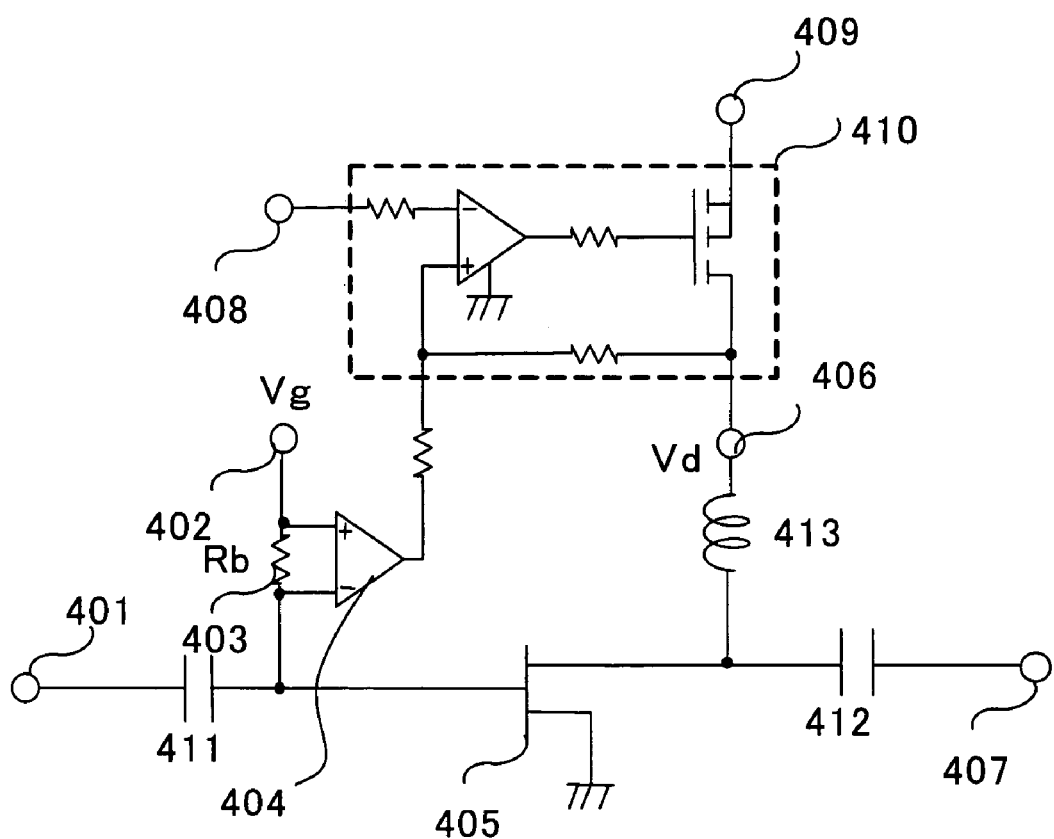
FIG. 3 is a block diagram showing the configuration of an electric power amplifying system containing a protection circuit for power amplifier according to Embodiment 3 of the invention.
Figure 4:
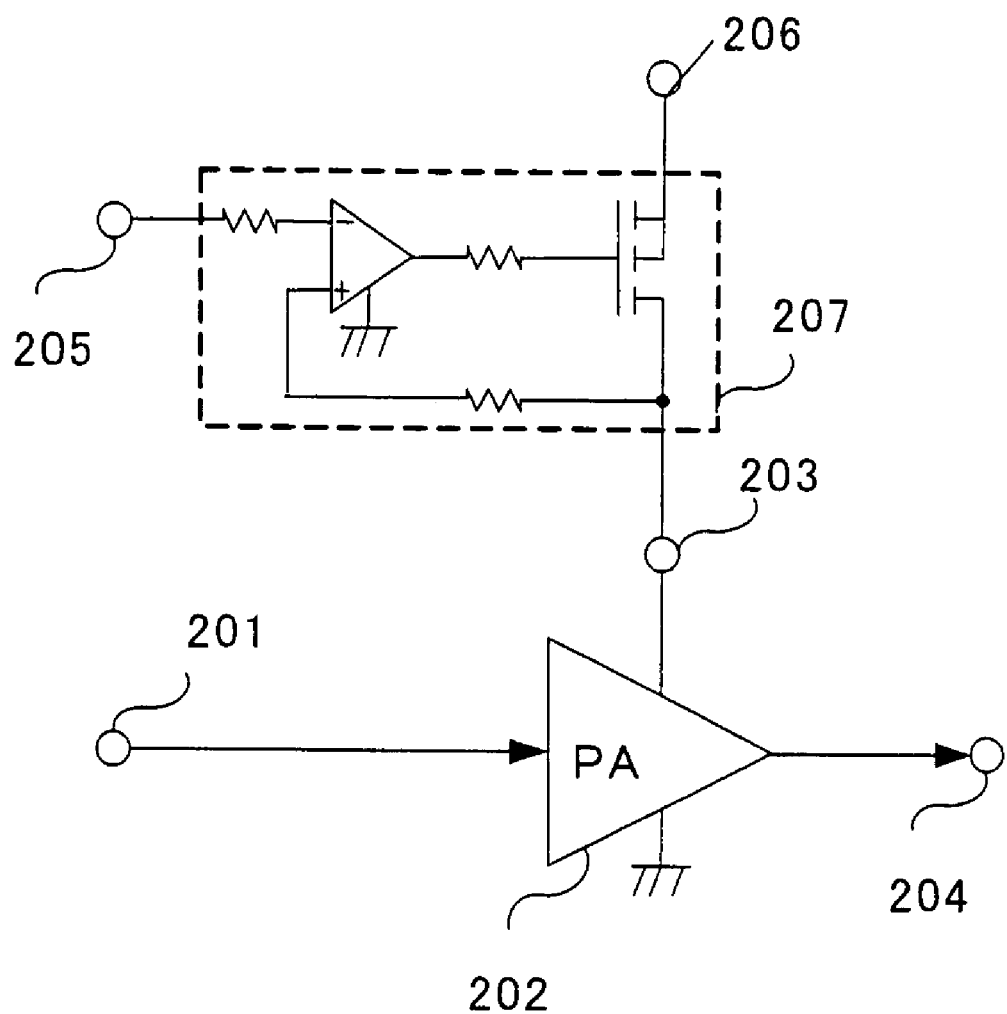
FIG. 4 is a block diagram showing the configuration of a prior art electric power amplifying system.

FIG. 3 is a block diagram showing the configuration of an electric power amplifying system containing a protection circuit for power amplifier according to Embodiment 3 of the invention. As shown in FIG. 3, the protection circuit for power amplifier comprises an input terminal 401, a gate power supply terminal 402, a gate resistor 403, a voltage conversion section 404, a field effect transistor 405, a drain power supply terminal 406, an output terminal 407, a power amplifier supply voltage control terminal 408, a DC power supply terminal 409, a power amplifier supply voltage control circuit 410, capacitors 411 and 412, and an inductor 413. The part consisting of the gate resistor 403 and the voltage conversion section 404 corresponds to current detecting means or breakdown condition detecting means for detecting an increase in the current flowing from the gate power supply terminal 402 into the gate of the field effect transistor 405.

Described below is the operation of the electric power amplifying system containing the protection circuit for power amplifier constructed as described above.

A high frequency signal or the like inputted through the input terminal 401 is amplified by the power amplifier which uses the field effect transistor 405 as a power device. The signal is then outputted through the output terminal 407.

On the other hand, electric power is supplied to the field effect transistor 405 as follows. That is, electric power to the gate is supplied from the gate power supply terminal 402 via the gate resistor 403. Further, electric power to the drain is supplied through the drain power supply terminal 406. At that time, a control signal provided through the power amplifier supply voltage control terminal 408 controls the power amplifier supply voltage control circuit 410. Under this control, the DC voltage inputted through the DC power supply terminal 409 is reduced to a specific voltage, and then applied to the drain of a field effect transistor 405.

At that time, in the supplying of the drain power, in order to prevent the drain current from flowing excessively and thereby causing breakdown to the field effect transistor 405, the current is detected that flows from the gate power supply terminal 402 into the gate of the field effect transistor 405 is detected. That is, a voltage is detected across the gate resistor 403. On the basis of the detected voltage, the drain supply voltage of the field effect transistor 405 serving as a power amplifier is reduced gradually depending on the level of the detected voltage when the drain current is to flow excessively. This prevents the field effect transistor 405 from approaching a breakdown condition, and hence protects the field effect transistor 405.

The voltage conversion section 404 outputs a voltage proportional to the gate current. When the voltage inputted from voltage conversion section 404 increases, the power amplifier supply voltage control circuit 410 accordingly reduces the power amplifier supply voltage. At that time, the sensitivity of the voltage conversion section 404 and the operating point of the power amplifier supply voltage control circuit 410 are adjusted into the optimum for the prevention of breakdown of the field effect transistor 405.

Also in the case of the field effect transistor 405, when the drain current flows excessively, an increased current flows from the gate power supply terminal 402 into the gate of the field effect transistor 405. In general, the gate current is extremely low in a field effect transistor. Nevertheless, in a high power amplifier, a high gate current flows in correspondence to its power, so that a notable change occurs in the gate current.

According to this configuration, when the voltage increases across the gate resistor 403 inserted into the current supply path running from the gate power supply terminal 402 to the gate of the field effect transistor 405, that is, when the power amplifier approaches a breakdown condition, the supply voltage is gradually reduced. This prevents an overcurrent from flowing into the drain of the field effect transistor 405 and thereby causing the field effect transistor 405 to approach a breakdown condition. Thus, the breakdown of the field effect transistor 405 is prevented that could be caused by a change in the operating conditions, such as load change, of the power amplifier.

In addition, since the load of the power amplifier does not need to be variable, the configuration is simple. Further, no drop occurs in the output power of the power amplifier in normal operation, so that a high electric power efficiency is obtained.

Furthermore, the supply voltage provided to the power amplifier is gradually reduced when the power amplifier approaches a breakdown condition. This causes no large disturbance to the transmitting operation. Thus, the state of communications remains stable.

INDUSTRIAL APPLICABILITY

A protection circuit for power amplifier according to the invention has the effect of preventing the breakdown of a power amplifier caused by a change in the operating conditions, such as load change, of the power amplifier. Thus, this circuit is useful in a high frequency power amplifier of a mobile communications device or the like.

What is claimed is:

1. A protection circuit for a bipolar transistor power amplifier, the protection circuit comprising:

a current detector that detects an increase in current flowing from a base power supply terminal into the base of the bipolar transistor so as to detect an approaching breakdown condition of the power amplifier; and a supply voltage controller that varies a supply voltage supplied to the power amplifier, wherein:

the current detector provides a detection signal to the supply voltage controller causing the supply voltage provided to the power amplifier to be gradually reduced when the approaching breakdown condition of the power amplifier is detected.

2. A protection circuit for a field effect transistor power amplifier, the protection circuit comprising:

a current detector that detects an increase in current flowing from a gate power supply terminal into the gate of the field effect transistor so as to detect an approaching breakdown condition of the power amplifier; and a supply voltage controller that varies a supply voltage supplied to the power amplifier, wherein:

the current detector provides a detection signal to the supply voltage controller causing the supply voltage provided to the power amplifier to be gradually reduced when the approaching breakdown condition of the power amplifier is detected.

* * * * *